United States Patent
Morioka et al.

(10) Patent No.: US 9,436,087 B2
(45) Date of Patent: Sep. 6, 2016

(54) SUBSTRATE PROCESSING APPARATUS WITH A CLEANING PROCESSING SECTION FOR CLEANING A CHEMICAL LIQUID PROCESSING SECTION

(71) Applicants: DAINIPPON SCREEN MFG. CO., LTD., Kyoto (JP); SOKUDO CO., LTD., Kyoto (JP)

(72) Inventors: Kazuo Morioka, Kyoto (JP); Masanori Imamura, Kyoto (JP); Satoshi Yamamoto, Kyoto (JP); Hideki Shimizu, Kyoto (JP)

(73) Assignees: SCREEN Holdings Co., Ltd. (JP); SCREEN Semiconductor Solutions Co., Ltd. (JP)

(*) Notice: Subject to any disclaimer, the term of this patent is extended or adjusted under 35 U.S.C. 154(b) by 0 days.

(21) Appl. No.: 14/322,982

(22) Filed: Jul. 3, 2014

(65) Prior Publication Data

US 2015/0013603 A1 Jan. 15, 2015

(30) Foreign Application Priority Data

Jul. 11, 2013 (JP) .................................. 2013-145514

(51) Int. Cl.
*B08B 3/08* (2006.01)
*B08B 3/04* (2006.01)
*B05B 15/00* (2006.01)
*H01L 21/67* (2006.01)
*B05C 11/10* (2006.01)
*G03F 7/16* (2006.01)
*B05B 15/02* (2006.01)
*B08B 9/02* (2006.01)
*G03F 7/42* (2006.01)

(52) U.S. Cl.
CPC .............. *G03F 7/16* (2013.01); *B05B 15/025* (2013.01); *B08B 3/04* (2013.01); *B08B 3/08* (2013.01); *B08B 9/02* (2013.01); *G03F 7/42* (2013.01); *H01L 21/67017* (2013.01); *H01L 21/67253* (2013.01); *H01L 21/6715* (2013.01)

(58) Field of Classification Search
None
See application file for complete search history.

(56) References Cited

U.S. PATENT DOCUMENTS

| | | | | |
|---|---|---|---|---|
| 2002/0069930 A1* | 6/2002 | Gregg | ........................ | B01J 4/00 141/4 |
| 2005/0175472 A1* | 8/2005 | Udagawa | ........... | B01D 19/0031 417/313 |
| 2007/0122551 A1* | 5/2007 | Yamamoto | ............ | G03F 7/2041 427/240 |

FOREIGN PATENT DOCUMENTS

| | | |
|---|---|---|
| JP | 2008-251890 | 10/2008 |
| JP | 2012-033886 | 2/2012 |

* cited by examiner

*Primary Examiner* — Binu Thomas
(74) *Attorney, Agent, or Firm* — Ostrolenk Faber LLP

(57) ABSTRACT

Each chemical processing section includes a chemical liquid bottle, a buffer tank, a pump, a filter, a discharge valve and a discharge nozzle. A chemical liquid stored in the chemical liquid bottle is led to the discharge nozzle and is discharged from the discharge nozzle to a substrate. A cleaning processing section includes a solvent bottle, a cleaning liquid bottle, the buffer tank and the pump. A solvent stored in the solvent bottle, a cleaning liquid stored in the cleaning liquid bottle and a gas supplied from a gas supply source are selectively led to the discharge nozzle in each chemical liquid processing section.

11 Claims, 10 Drawing Sheets

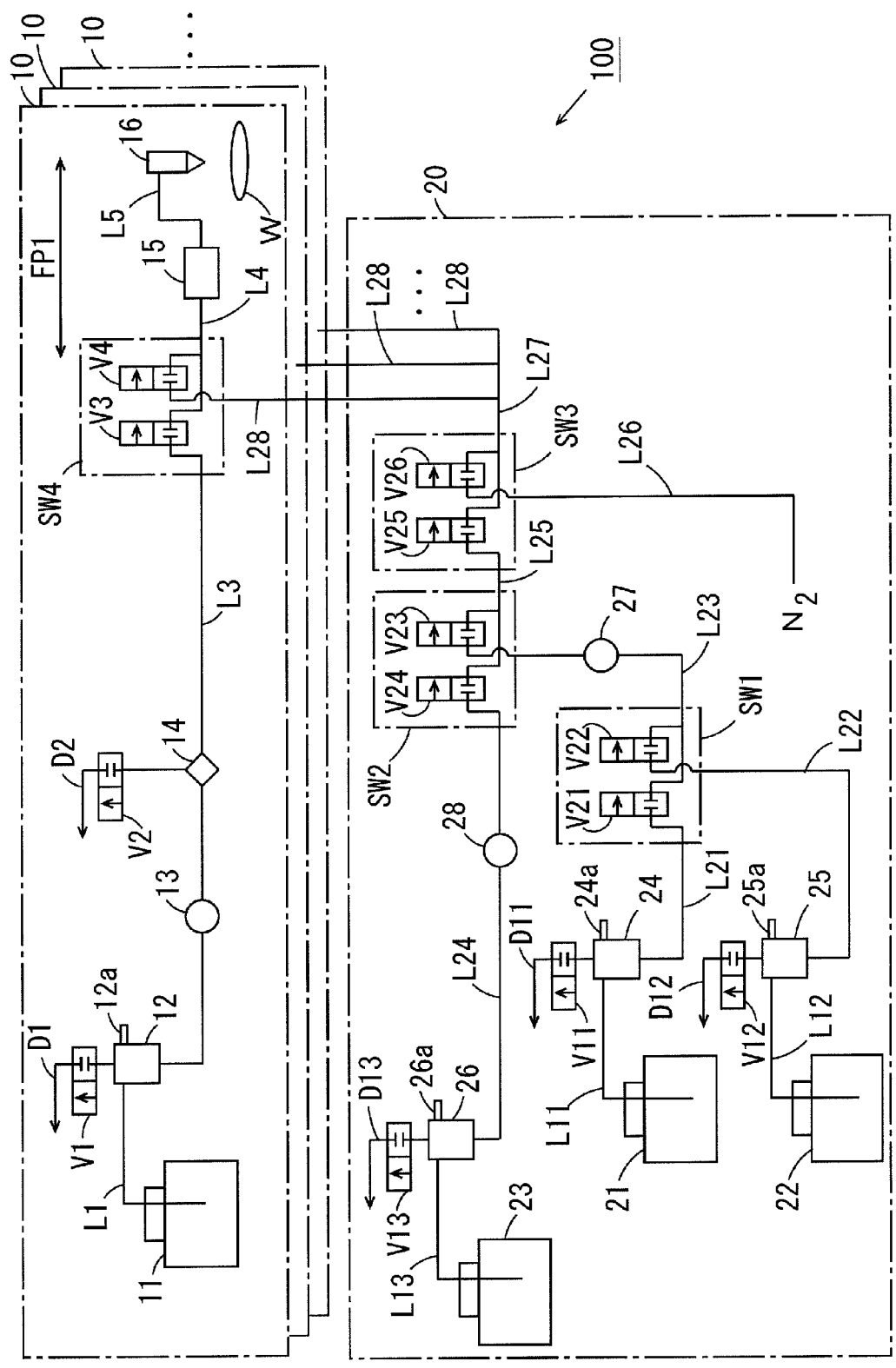
F I G. 1

FIG. 5

CLEANING SETTING SCREEN

| NOZZLE | CLEANING LIQUID REPLACEMENT TIME PERIOD (SECONDS) | DISCHARGE VALVE OPENING/CLOSING INTERVAL (MINUTES) | SOLVENT REPLACEMENT TIME PERIOD (SECONDS) | NUMBER OF RESIST REPLACEMENT (TIMES) | TYPE OF SOLVENT | NITROGEN GAS DISCHARGE TIME PERIOD (SECONDS) |
|---|---|---|---|---|---|---|
| 1 | 45 | 2 | 80 | 5 | FIRST SOLVENT | 45 |
| 2 | 45 | 2 | 80 | 5 | FIRST SOLVENT | 45 |
| 3 | 50 | 2 | 80 | 5 | FIRST SOLVENT | 50 |
| 4 | 40 | 2 | 60 | 5 | FIRST SOLVENT | 40 |
| 5 | 40 | 1 | 50 | 10 | SECOND SOLVENT | 40 |
| 6 | 70 | 1 | 50 | 10 | FIRST SOLVENT | 70 |
| 7 | 70 | 1 | 50 | 10 | SECOND SOLVENT | 70 |
| 8 | 70 | 1 | 50 | 10 | FIRST SOLVENT | 70 |

F I G. 7

| DESIGNATED CLEANING STEP | INSIDE-VALVE FLUID | | | |
|---|---|---|---|---|
| | RESIST | CLEANING LIQUID | SOLVENT | NITROGEN GAS |
| CLEANING LIQUID REPLACEMENT | ○ | ○ | ○ | ○ |
| OPENING/CLOSING VALVE | × | ○ | × | × |
| SOLVENT REPLACEMENT | ○ | ○ | ○ | ○ |
| RESIST REPLACEMENT | × | × | ○ | ○ |
| NITROGEN GAS REPLACEMENT | × | ○ | ○ | ○ |

FIG. 8

| DESIGNATED CLEANING STEP | CLEANING STEP IN PROGRESS | | | | |
|---|---|---|---|---|---|
| | CLEANING LIQUID REPLACEMENT | OPENING/CLOSING VALVE | SOLVENT REPLACEMENT | RESIST REPLACEMENT | NITROGEN GAS REPLACEMENT |
| CLEANING LIQUID REPLACEMENT | × | ○ | × | △ | × |
| OPENING/CLOSING VALVE | △ | △ | × | △ | × |
| SOLVENT REPLACEMENT | × | × | × | △ | × |
| RESIST REPLACEMENT | △ | △ | △ | △ | △ |
| NITROGEN GAS REPLACEMENT | × | × | × | △ | ○ |

SUBSTRATE PROCESSING APPARATUS WITH A CLEANING PROCESSING SECTION FOR CLEANING A CHEMICAL LIQUID PROCESSING SECTION

BACKGROUND OF THE INVENTION

1. Field of the Invention

The present invention relates to a substrate processing apparatus that performs a process on a substrate.

2. Description of Related Art

Substrate processing apparatuses are used to subject various types of substrates such as semiconductor substrates, substrates for liquid crystal displays, plasma displays, optical disks, magnetic disks, magneto-optical disks, and photomasks, and other substrates to various types of processing. For example, a process is performed on a substrate using various types of chemical liquids in the substrate processing apparatus (see JP 2008-251890 A, for example).

In a resist coating processing section in which a resist is applied to the substrate as the chemical liquid, the resist stored in a chemical liquid bottle is normally led to a trap tank by a discharge pump. The resist stored in the trap tank is led to a discharge nozzle by the discharge pump. The resist is purified by a filter on the route from the trap tank to the discharge nozzle. If a discharge valve is open, the resist is discharged from the discharge nozzle, and if the discharge valve is closed, the discharge of the resist from the discharge nozzle is stopped.

BRIEF SUMMARY OF THE INVENTION

As described above, in the substrate processing apparatus that performs the process on the substrate using the chemical liquid, a component of the chemical liquid may adhere to a certain spot (a valve, for example) and may be solidified depending on the type of the chemical liquid. If such a solid matter accumulates, the solid matter may cause particles to be formed, and the yield of the product may decrease. Further, if the solid matter accumulates, a discharge amount of the chemical liquid, a discharging time point or the like cannot be accurately controlled. Therefore, it is necessary to regularly clean the certain spot where the solid matter is likely to accumulate.

A cleaning liquid bottle that stores a cleaning liquid is used instead of the chemical liquid bottle during cleaning. The cleaning liquid is led to the discharge nozzle from the cleaning liquid bottle, so that the solid matter that adheres to the certain spot is removed. In this case, the cleaning liquid is led to the valve through the filter provided on the route. Normally, the filter through which the cleaning liquid has passed cannot be used thereafter. Therefore, it is necessary to exchange the filter every time the above-mentioned cleaning is performed. Therefore, the cleaning operation becomes complicated and a cost increases.

An object of the present invention is to provide a substrate processing apparatus that can clean a predetermined portion on a route that leads a chemical liquid to a discharge nozzle while complication of operation and an increase in cost are inhibited.

According to one aspect of the present invention, a substrate processing apparatus includes a chemical liquid processing section in which a process is performed on a substrate by a chemical liquid, a cleaning processing section in which a cleaning process is performed on the chemical liquid processing section, and a controller configured to control the chemical liquid processing section and the cleaning processing section, wherein the chemical liquid processing section includes a chemical liquid storage configured to store the chemical liquid, a discharge nozzle configured to discharge the chemical liquid, a first pipe for leading the chemical liquid stored in the chemical liquid storage to the discharge nozzle, a supply device provided at the first pipe and configured to supply the chemical liquid stored in the chemical liquid storage to the discharge nozzle through the first pipe, a flow path opening/closing unit provided at a portion of the first pipe at a further downstream position than the supply device and configured to be capable of opening and closing a flow path in the first pipe, and a filter provided at a portion of the first pipe that is located at a further downstream position than the supply device and at a further upstream position than the flow path opening/closing unit, the cleaning processing section includes a second pipe for leading a cleaning liquid to the first pipe, a third pipe for leading a gas to the first pipe, and a switching unit configured to be capable of switching a flow path in the first, second and third pipes such that the chemical liquid, the cleaning liquid and the gas are selectively led to a predetermined flow path range of the first pipe and the cleaning liquid does not pass through the filter, and the controller controls the switching unit such that the cleaning liquid and the gas are alternately led to the flow path range a number of times.

In the substrate processing apparatus, the chemical liquid stored in the chemical liquid storage is led to the discharge nozzle through the first pipe in the chemical liquid processing section. The flow path in the first pipe is opened and closed by the flow path opening/closing unit. The chemical liquid purified by the filter is supplied to the discharge nozzle by the supply device with the flow path in the first pipe being open by the flow path opening/closing unit. Thus, the chemical liquid is discharged from the discharge nozzle to the substrate, and the process is performed on the substrate.

In the cleaning processing section, the cleaning liquid is led to the first pipe through the second pipe, and the gas is led to the first pipe through the third pipe. The flow path in the first, second and third pipes is switched by the switching unit, whereby the chemical liquid, the cleaning liquid and the gas are selectively led to the predetermined flow path range of the first pipe. The cleaning liquid is led to the above-mentioned flow path range, so that the cleaning process of the above-mentioned flow path range is performed. In this case, because the cleaning liquid does not pass through the filter, it is not necessary to exchange the filter after the cleaning process. As a result, a predetermined portion on the route that leads the chemical liquid to the discharge nozzle can be cleaned while complication of the cleaning operation and an increase in cost are inhibited.

Further, during the cleaning process, the cleaning liquid and the gas are alternately led to the above-mentioned flow path range a number of times. Thus, the cleaning and draining of liquid in the above-mentioned flow path range are repeated, and a solid matter that adheres to the above-mentioned flow path range can be removed in steps. As a result, a predetermined portion on the route that leads the chemical liquid to the discharge nozzle can be efficiently sufficiently cleaned.

The chemical liquid stored in the chemical liquid storage may include a solvent, the cleaning processing section may further include a fourth pipe for leading a replacement solvent that includes a same component or a same type of component as the solvent included in the chemical liquid stored in the chemical liquid storage to the first pipe, the switching unit may be configured to be capable of switching the flow path in the first, second, third and fourth pipes such that the chemical liquid, the cleaning liquid, the gas and the replacement solvent are selectively led to the flow path range of the first pipe and the cleaning liquid does not pass through the filter, and the controller may control the switching unit such that the replacement solvent is led to the flow path range after the cleaning liquid is led to the flow path range, and the chemical liquid is led to the flow path range after the replacement solvent is led to the flow path range.

In this case, the flow path in the first, second, third and fourth pipes is switched by the switching unit, so that the chemical liquid, the cleaning liquid, the gas and the replacement solvent are selectively led to the above-mentioned flow path range of the first pipe. During the cleaning process, the replacement solvent is led to the above-mentioned flow path range after the cleaning liquid is led to the above-mentioned flow path range. Thus, the cleaning liquid in the above-mentioned flow path range is replaced with the replacement solvent. Thereafter, the chemical liquid is led to the above-mentioned flow path range, so that the replacement solvent in the above-mentioned flow path range is replaced with the chemical liquid. Thus, the process using the chemical liquid can be continuously performed on the substrate.

The cleaning liquid is replaced with the replacement solvent, so that a residue of the cleaning liquid can be prevented at a low cost. Further, because the replacement solvent made of the same component or the same type of component as the solvent included in the chemical liquid is used, the replacement solvent is prevented from influencing the composition of the chemical liquid. Thus, a processing defect does not occur at the substrate due to the replacement solvent. Therefore, a processing defect of the substrate can be reliably prevented while the amount of the expensive chemical liquid to be used is inhibited.

According to another aspect of the present invention, a substrate processing apparatus includes a chemical liquid processing section in which a process is performed on a substrate by a chemical liquid, a cleaning processing section in which a cleaning process is performed on the chemical liquid processing section, and a controller configured to control the chemical liquid processing section and the cleaning processing section, wherein the chemical liquid processing section includes a chemical liquid storage configured to store the chemical liquid that includes a solvent, a discharge nozzle configured to discharge the chemical liquid, a first pipe for leading the chemical liquid stored in the chemical liquid storage to the discharge nozzle, a supply device provided at the first pipe and configured to supply the chemical liquid stored in the chemical liquid storage to the discharge nozzle through the first pipe, a flow path opening/closing unit provided at a portion of the first pipe at a further downstream position than the supply device and configured to be capable of opening and closing a flow path in the first pipe, and a filter provided at a portion of the first pipe that is located at a further downstream position than the supply device and at a further upstream position than the flow path opening/closing unit, wherein the cleaning processing section includes a second pipe for leading a cleaning liquid to the first pipe, a fourth pipe for leading a replacement solvent that includes a same component or a same type of component as a solvent included in the chemical liquid stored in the chemical liquid storage, and a switching unit configured to be capable of switching a flow path in the first, second and fourth pipes such that the chemical liquid, the cleaning liquid and the replacement solvent are selectively led to a predetermined flow path range of the first pipe and the cleaning liquid does not pass through the filter, and the controller controls the switching unit such that the replacement solvent is led to the flow path range after the cleaning liquid is led to the flow path range, and the chemical liquid is led to the flow path range after the replacement solvent is led to the flow path range.

In the substrate processing apparatus, the chemical liquid stored in the chemical liquid storage is led to the discharge nozzle through the first pipe in the chemical liquid processing section. The flow path in the first pipe is opened and closed by the flow path opening/closing unit. The chemical liquid purified by the filter is supplied to the discharge nozzle by the supply device with the flow path in the first pipe being opened by the flow path opening/closing unit. Thus, the chemical liquid is discharged from the discharge nozzle to the substrate, and the process is performed on the substrate.

In the cleaning processing section, the cleaning liquid is led to the first pipe through the second pipe, and the replacement solvent is led to the first pipe through the fourth pipe. The flow path in the first, second and fourth pipes is switched by the switching unit, whereby the chemical liquid, the cleaning liquid and the replacement solvent are selectively led to the predetermined flow path range of the first pipe. The cleaning liquid is led to the above-mentioned flow path range, so that the cleaning process for the above-mentioned flow path range is performed. In this case, because the cleaning liquid does not pass through the filter, it is not necessary to exchange the filter after the cleaning process. As a result, a predetermined portion on the route that leads the chemical liquid to the discharge nozzle can be cleaned while complication of the cleaning operation and an increase in cost are inhibited.

Further, during the cleaning process, the replacement solvent is led to the above-mentioned flow path range after the cleaning liquid is led to the above-mentioned flow path range. Thus, the cleaning liquid in the above-mentioned flow path range is replaced with the replacement solvent. Thereafter, the chemical liquid is led to the above-mentioned flow path range, so that the replacement solvent in the above-mentioned flow path range is replaced with the chemical liquid. Thus, the process using the chemical liquid can be continuously performed on the substrate.

In this case, the cleaning liquid is replaced with the replacement solvent, so that a residue of the cleaning liquid can be prevented at a low cost. Further, because the replacement solvent made of the same component or the same type of component as the solvent included in the chemical liquid is used, the replacement solvent is prevented from influencing the composition of the chemical liquid. Thus, a processing defect does not occur at the substrate due to the replacement solvent. Therefore, a processing defect of the substrate can be reliably prevented while the amount of expensive chemical liquid to be used is inhibited.

The flow path opening/closing unit may be provided in the flow path range. In this case, the cleaning process is performed on the flow path opening/closing unit, and a solid matter that adheres to the flow path opening/closing unit can be removed. Thus, accumulation of particles at the flow path opening/closing unit can be prevented, and the flow path opening/closing unit can be kept clean. Further, the opening and closing of the flow path in the first pipe by the flow path opening/closing unit can be accurately performed.

The controller may control the switching unit and the flow path opening/closing unit such that the flow path opening/closing unit is successively opened and closed with the cleaning liquid being led to the flow path opening/closing unit. In this case, a solid matter that adheres to the flow path opening/closing unit can be effectively stripped. Thus, the flow path opening/closing unit can be efficiently cleaned.

The supply device may be provided in the flow path range. In this case, the cleaning process is performed on the supply device, and a solid matter that adheres to the supply device can be removed. Thus, the supply device can be kept clean, and the supply of the chemical liquid to the discharge nozzle by the supply device can be accurately performed.

According to yet another aspect of the present invention, a substrate processing apparatus includes a chemical liquid processing section in which a process is performed on a substrate by a chemical liquid, a cleaning processing section in which a cleaning process is performed on the chemical liquid processing section, and a controller configured to control the chemical liquid processing section and the cleaning processing section, wherein the chemical liquid processing section includes a chemical liquid storage configured to store the chemical liquid, a discharge nozzle configured to discharge the chemical liquid, a first pipe for leading the chemical liquid stored in the chemical liquid storage to the discharge nozzle, a supply device provided at the first pipe and configured to supply the chemical liquid stored in the chemical liquid storage to the discharge nozzle through the first pipe, a flow path opening/closing unit provided at a portion of the first pipe at a further downstream position than the supply device and configured to be capable of opening and closing a flow path in the first pipe, and a filter provided at a portion of the first pipe that is located at a further downstream position than the supply device and at a further upstream position than the flow path opening/closing unit, the cleaning processing section includes a second pipe for leading a cleaning liquid to the first pipe, and a switching unit configured to be capable of switching the flow path in the first and second pipes such that the chemical liquid and the cleaning liquid are selectively led to the flow path opening/closing unit and the cleaning liquid does not pass through the filter, and the controller controls the switching unit and the flow path opening/closing unit such that the flow path opening/closing unit is successively opened and closed with the cleaning liquid being led to the flow path opening/closing unit.

In the substrate processing apparatus, the chemical liquid stored in the chemical liquid storage is led to the discharge nozzle through the first pipe in the chemical liquid processing section. The flow path in the first pipe is opened and closed by the flow path opening/closing unit. The chemical liquid purified by the filter is supplied to the discharge nozzle by the supply device with the flow path in the first pipe being opened by the flow path opening/closing unit. Thus, the chemical liquid is discharged from the discharge nozzle to the substrate, and the process is performed on the substrate.

In the cleaning processing section, the cleaning liquid is led to the first pipe through the second pipe. The flow path in the first and second pipes is switched by the switching unit, so that the chemical liquid and the cleaning liquid are selectively led to a predetermined flow path range of the first pipe. The cleaning liquid is led to the above-mentioned flow path range, so that the cleaning process for the above-mentioned flow path range is performed. In this case, because the cleaning liquid does not pass through the filter, it is not necessary to exchange the filter after the cleaning process. As a result, a predetermined portion on the route that leads the chemical liquid to the discharge nozzle can be cleaned while complication of the cleaning operation and an increase in cost are inhibited.

Further, during the cleaning process, the flow path opening/closing unit is successively opened and closed with the cleaning liquid being led to the above-mentioned flow path opening/closing unit. Thus, a solid matter that adheres to the above-mentioned flow path range can be effectively stripped. As a result, a predetermined portion on the route that leads the chemical liquid to the discharge nozzle can be efficiently sufficiently cleaned.

The cleaning processing section may further include a pumping device configured to pump the cleaning liquid through the second pipe, and the controller may control the pumping device such that the cleaning liquid is pumped at the time of opening the flow path opening/closing unit during a period in which the flow path opening/closing unit is successively opened and closed with the cleaning liquid being led to the flow path opening/closing unit.

In this case, a solid matter that adheres to the above-mentioned flow path range can be effectively stripped by the pressure of the cleaning liquid.

The plurality of chemical processing sections may be provided, the substrate processing apparatus may further include an operation unit operated by a user in order to designate at least one chemical liquid processing section of the plurality of chemical liquid processing sections, wherein the controller may control the cleaning processing section to selectively perform the cleaning process on the designated chemical processing section of the plurality of chemical processing sections based on operation of the operation unit.

In this case, the cleaning process for the above-mentioned flow path range is performed in the designated chemical liquid processing section, and the process by the chemical liquid can be continuously performed on the substrate in another chemical liquid processing section. Thus, the cleaning process can be suitably performed in the above-mentioned flow path range in each chemical liquid processing section while a decrease in throughput is inhibited.

The present invention enables a predetermined portion on the route that leads the chemical liquid to the discharge nozzle to be cleaned while complication of the operation and an increase in cost are inhibited.

Other features, elements, characteristics, and advantages of the present invention will become more apparent from the following description of preferred embodiments of the present invention with reference to the attached drawings.

BRIEF DESCRIPTION OF THE SEVERAL VIEWS OF THE DRAWING

FIG. 1 is a diagram showing the configuration of a substrate processing apparatus according to a first embodiment of the present invention;

FIG. 5 is a diagram showing one example of a cleaning setting screen;

FIG. 7 is a diagram for explaining a first example of interlock information;

FIG. 8 is a diagram for explaining a second example of the interlock information;

DESCRIPTION OF THE PREFERRED EMBODIMENTS

Figure 2:
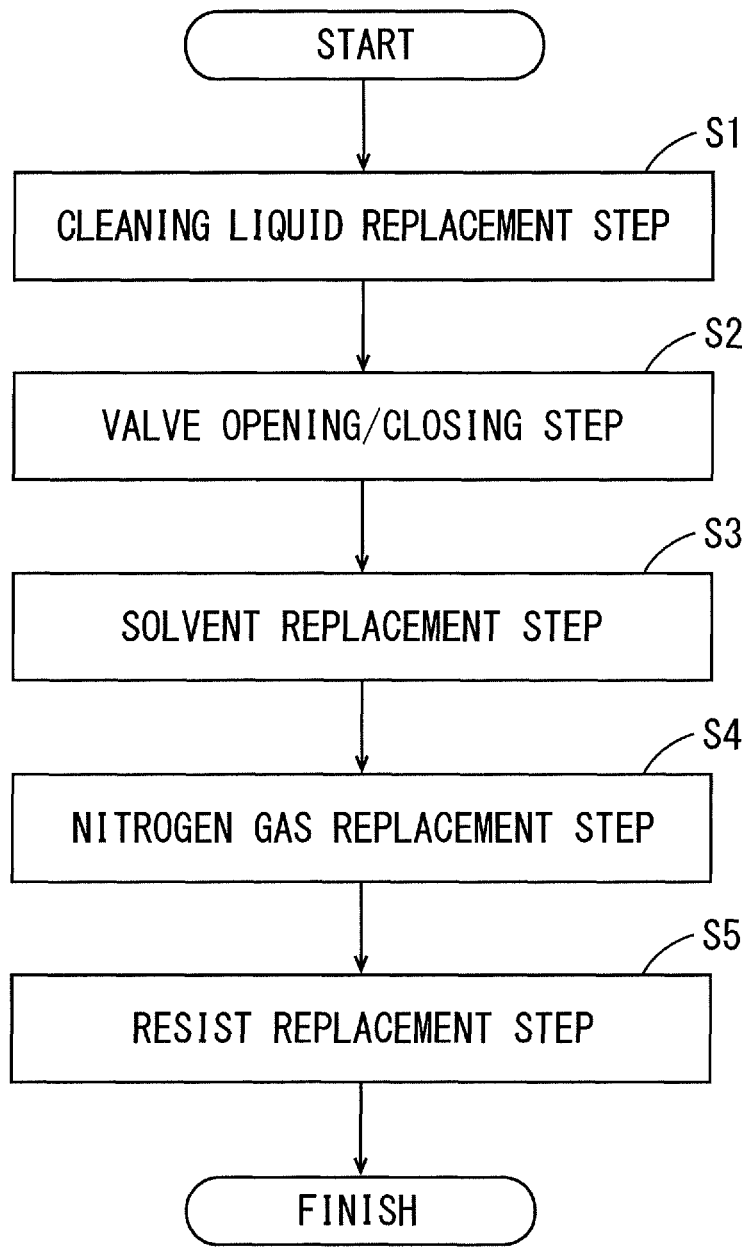
FIG. 2 is a flow chart for explaining a first example of a valve cleaning process.

A substrate processing apparatus according to embodiments of the present invention will be described below with reference to diagrams. In the following description, a substrate refers to a semiconductor substrate, a substrate for a liquid crystal display, a substrate for a plasma display, a glass substrate for a photomask, a substrate for an optical disk, a substrate for a magnetic disk, a substrate for a magneto-optical disk, a substrate for a photomask or the like.

(1) First Embodiment (1-1) Configuration

FIG. 1 is a diagram showing the configuration of the substrate processing apparatus 100 according to a first embodiment of the present invention. As shown in FIG. 1, the substrate processing apparatus 100 includes a plurality of chemical liquid processing sections 10 and a cleaning processing section 20. Each chemical liquid processing section 10 includes a chemical liquid bottle 11, a buffer tank 12, a pump 13, a filter 14, a discharge valve 15 and a discharge nozzle 16. A chemical liquid for performing a process on the substrate is stored in the chemical liquid bottle 11. The chemical liquid includes a resin component and a solvent component. In the present embodiment, a color resist (hereinafter referred to as a resist) is used as the chemical liquid. The chemical bottle 11 is connected to the buffer tank 12 through a pipe L1. A gas (a nitrogen gas, for example) is supplied from a gas supply source (not shown) to the chemical liquid bottle 11, whereby the resist in the chemical liquid bottle 11 is led to the buffer tank 12 through the pipe L1.

A liquid surface sensor 12a is provided at the buffer tank 12. When the resist in the chemical liquid bottle 11 is gone, the liquid surface in the buffer tank 12 is gradually lowered. When the lowering of the liquid surface in the buffer tank 12 is detected by the liquid surface sensor 12a, bottle exchange warning for prompting the user to exchange the chemical liquid bottle 11 is generated. Details of the bottle exchange warning will be described below.

Further, a discharge pipe D1 is connected to the buffer tank 12, and a valve V1 is inserted into the discharge pipe D1. The valve V1 is opened, so that the remaining gas in the buffer tank 12 is discharged through the discharge pipe D1.

One end of a pipe L3 is connected to the buffer tank 12. The pump 13, the filter 14 and a switching valve V3 are inserted into the pipe L3 in this order from an upstream position. The resist in the buffer tank 12 is pumped toward a downstream position by the pump 13 through the pipe L3, and impurities included in the resist are removed by the filter 14. A discharge pipe D2 is connected to the filter 14, and a valve V2 is inserted into the discharge pipe D2. The valve V2 is opened, so that the remaining gas in the filter 14 is discharged through the discharge pipe D2.

The other end of the pipe L3 is connected to one end of a pipe L4 to join a below-mentioned pipe L28. A switching valve V4 is inserted into the pipe L28. A switching unit SW4 is constituted by the switching valves V3, V4. The other end of the pipe L4 is connected to the discharge valve 15. The discharge valve 15 is connected to the discharge nozzle 16 through a pipe L5.

The switching valve V3 is opened and the switching valve V4 is closed, so that the resist is led to the discharge valve 15 through the pipe L4. In that state, the discharge valve 15 is opened, so that the resist is supplied to the discharge nozzle 16 through the pipe L5 and discharged from the discharge nozzle 16 toward the substrate W. Thus, a resist coating process is performed on the substrate W.

The cleaning processing section 20 includes solvent bottles 21, 22, a cleaning liquid bottle 23, buffer tanks 24, 25, 26 and pumps 27, 28. A solvent is stored in each of the solvent bottles 21, 22. As the solvent, a solvent that includes the same or similar component as/to the solvent included in the resist is used. For example, as the solvent that includes the same or similar component as/to the solvent included in the resist, cyclohexanone, propylene glycol monomethylether acetate (PGMEA), propylene glycol monomethylether (PGME), ethyl lactate (EL), gamma-butyrolactone (GBL), N-methyl-2-pyrrolidone (NMP) or the mixture of them (a liquid mixture of PGMEA and PGME, for example) is used.

In the present example, two types of resists are used in the plurality of chemical liquid processing sections 10, and two types of solvents are respectively stored in the solvent bottles 21, 22. Hereinafter, the solvent stored in the solvent bottle 21 is referred to as a first solvent, and the solvent stored in the solvent bottle 22 is referred to as a second solvent. The first solvent includes the same component as the solvent included in the one resist of the above-mentioned two types of resists, and the second solvent includes the same component as the solvent included in the other one of the above-mentioned two types of resists.

The solvent bottle 21 is connected to the buffer tank 24 through a pipe L11. A gas is supplied from the gas supply source (not shown) to the solvent bottle 21, whereby the first solvent in the solvent bottle 21 is led to the buffer tank 24 through the pipe L11. A liquid surface sensor 24a is provided at the buffer tank 24. When the lowering of the liquid surface in the buffer tank 24 is detected by the liquid surface sensor 24a, the bottle exchange warning for prompting the user to exchange the solvent bottle 21 is generated. A discharge pipe D11 is connected to the buffer tank 24, and the valve V11 is inserted into the discharge pipe D11. The valve V11 is opened, so that the remaining gas in the buffer tank 24 is discharged through the discharge pipe D11.

The solvent bottle 22 is connected to the buffer tank 25 through a pipe L12. A gas is supplied from the gas supply source (not shown) to the solvent bottle 22, whereby the second solvent in the solvent bottle 22 is led to the buffer tank 25 through the pipe L12. A liquid surface sensor 25a is provided at the buffer tank 25. When the lowering of the liquid surface in the buffer tank 25 is detected by the liquid surface sensor 25a, the bottle exchange warning for prompting the user to exchange the solvent bottle 22 is generated. Further, a discharge pipe D12 is connected to the buffer tank 25, and a valve V12 is inserted into the discharge pipe D12. The valve V12 is opened, so that the remaining gas in the buffer tank 25 is discharged through the discharge pipe D12.

One end of a pipe L21 is connected to the buffer tank 24, and one end of a pipe L22 is connected to the buffer tank 25. A switching valve V21 is inserted into the pipe L21, and a switching valve V22 is inserted into the pipe L22. A switching section SW1 is constituted by the switching valves V21, V22. The other ends of the pipes L21, L22 are respectively connected to one end of a pipe L23. The pump 27 and a switching valve V23 are sequentially inserted into the pipe L23 from an upstream position. The first solvent in the buffer tank 24 or the second solvent in the buffer tank 25 is pumped by the pump 27 toward a downstream position through the pipe L23.

A cleaning liquid is stored in the cleaning liquid bottle 23. As the cleaning liquid, for example, N-methyl-2-pyrrolidone (NMP), isopropyl alcohol (IPA), cyclohexznone or acetone is used. For example, when a color resist is used as the resist, N-methyl-2-pyrrolidone is used as the cleaning liquid. Further, when another photoresist is used as the resist, acetone or isopropyl alcohol is used as the cleaning liquid.

The cleaning liquid bottle 23 is connected to the buffer tank 26 through a pipe L13. A gas is supplied from the gas supply source (not shown) to the cleaning liquid bottle 23, whereby the cleaning liquid in the cleaning liquid bottle 23 is led to the buffer tank 26 through the pipe L13. A liquid surface sensor 26a is provided at the buffer tank 26. When the lowering of the liquid surface in the buffer tank 26 is detected by the liquid surface sensor 26a, the bottle exchange warning for prompting the user to exchange the cleaning liquid bottle 23 is generated. Further, a discharge pipe D13 is connected to the buffer tank 26, and a valve V13 is inserted into the discharge pipe D13. The valve V13 is opened, so that the remaining gas in the buffer tank 26 is discharged through the discharge pipe D13.

One end of a pipe L24 is connected to the buffer tank 26. A pump 28 and a switching valve V24 are sequentially inserted into the pipe L24 from an upstream position. The cleaning liquid in the buffer tank 26 is pumped by the pump 28 toward a downstream position through the pipe L24. A switching section SW2 is constituted by the switching valves V23, V24. The other end of the pipe L23 and the other end of the pipe L24 are respectively connected to one end of a pipe L25. The switching valve V25 is inserted into the pipe L25.

One end of a pipe L26 is connected to the gas supply source (not shown). A gas is supplied from the gas supply source through the pipe L26. In the present embodiment, the nitrogen gas is used as the gas. A switching valve V26 is inserted into the pipe L26. A switching section SW3 is constituted by switching valves V25, V26. The other end of the pipe L25 and the other end of the pipe L26 are respectively connected to the one end of a pipe L27. The other end of the pipe L27 is connected to one ends of the plurality of pipes L28 provided to respectively correspond to the plurality of chemical liquid processing sections 10. The other ends of the plurality of pipes L28 are respectively connected to one ends of the pipes L4 of the corresponding chemical liquid processing sections 10. The switching section SW4 is constituted by the switching valve V3 of each chemical liquid processing section 10, and the switching valve V4 provided at the pipe L28 that corresponds to the chemical liquid processing section 10.

In the switching section SW1, one of the switching valves V21, V22 is opened, and the other one is closed. In the switching section SW2, one of the switching valves V23, V24 is opened, and the other one is closed. In the switching section SW3, the switching valves V25, V26 are respectively independently opened and closed. In each switching section SW4, the switching valves V3, V4 are respectively independently opened and closed. The switching sections SW1 to SW4 are controlled, so that the resist, the first or second solvent, the cleaning liquid or the nitrogen gas can be selectively led to the discharge valve 15.

(1-2) Valve Cleaning Process

In the present embodiment, the resist, the first and second solvents, the cleaning liquid and the nitrogen gas are selectively led to the discharge valve 15, so that a cleaning process of the discharge valve 15 (hereinafter referred to as a valve cleaning process) is performed. In the valve cleaning process, a plurality of cleaning steps are selectively performed. The cleaning steps include a cleaning liquid replacement step, a valve opening/closing step, a solvent replacement step, a resist replacement step and a nitrogen gas replacement step.

In the cleaning liquid replacement step, the cleaning liquid is led to the discharge valve 15. In the valve opening/closing step, the discharge valve 15 is successively opened and closed. In the solvent replacement step, the first or second solvent is led to the discharge valve 15. In the resist replacement step, the resist is led to the discharge valve 15. In the nitrogen gas replacement step, the nitrogen gas is led to the discharge valve 15.

Hereinafter, the valve cleaning process will be specifically described. Note that the valve cleaning process is performed in each chemical liquid processing section 10 after the resist coating process is performed on the substrate W. Therefore, at the start of the valve cleaning process, the resist remains in each pipe and the discharge valve 15 in the chemical liquid processing section 10. Further, at the time of the valve cleaning process, the discharge nozzle 16 is moved onto a waiting pod (not shown). In the chemical processing section 10 in which the valve cleaning process is not performed, the resist coating process on the substrate W can be successively performed.

In the present embodiment, a flow path in the pipe L4, the discharge valve 15 and the pipe L5 is a predetermined flow path range FP1.

(1-2-1) First Example

FIG. 2 is a flow chart for explaining the first example of the valve cleaning process. In the first example, the cleaning liquid replacement step (step S1), the valve opening/closing step (step S2), the solvent replacement step (step S3), the nitrogen gas replacement step (step S4) and the resist replacement step (step S5) are sequentially performed.

In the cleaning liquid replacement step of step S1, the switching sections SW1 to SW4 are first controlled such that the cleaning liquid is led to the discharge valve 15 with the discharge valve 15 of FIG. 1 being closed. Specifically, the switching valve V23 in the switching section SW2 is closed and the switching valve V24 is opened, the switching valve V25 of the switching section SW3 is opened and the switching valve V26 is closed, and the switching valve V3 of the switching SW4 is closed and the switching valve V4 is opened. In the switching section SW1, either one of the switching valves V21, V22 may be opened.

Subsequently, the discharge valve 15 is opened, and the cleaning liquid is pumped by the pump 28. Thus, the resist in the pipe L4, the discharge valve 15 and the pipe L5 is pushed out by the cleaning liquid and is discharged with the cleaning liquid through the discharge nozzle 16. As a result, the resist in the pipe L4, the discharge valve 15 and the pipe L5 are replaced with the cleaning liquid. In this case, because the cleaning liquid is pumped through the discharge valve 15, a solid matter that adheres to the discharge valve 15 is cleaned away by the cleaning liquid. When a predetermined time period has elapsed, the discharge valve 15 is closed, and the pumping of the cleaning liquid by the pump 28 is stopped. A state in which the pipe L4, the discharge valve 15 and the pipe L5 are filled with the cleaning liquid is maintained for a predetermined time period, whereby the resist that adheres to the insides of the pipe L4, the discharge valve 15 and the pipe L5 can be effectively dissolved.

In the valve opening/closing step of step S2, the discharge valve 15 is temporarily (0.5 second, for example) opened, and the cleaning liquid is pumped by the pump 28 every time a predetermined time period has elapsed. Thus, a solid matter that adheres to the discharge valve 15 is effectively stripped and cleaned away by the cleaning liquid. In step S2, the opening and closing of the discharge valve 15 may be performed without the pumping of the cleaning liquid by the pump 28 while the pipe L4, the discharge valve 15 and the pipe L5 are kept filled with the cleaning liquid.

In the solvent replacement step of step S3, the switching sections SW1 to SW4 are first controlled such that the solvent of the first and second solvents that includes the same component as the solvent (hereinafter referred to as a resist solvent) included in the resist used in the resist coating process is led to the discharge valve 15 with the discharge valve 15 being closed. The resist solvent is selected by the user in advance. For example, when the color resist is used as the resist, propylene glycol monomethylether acetate, propylene glycol monomethylether, cyclohexanone or a liquid mixture of PGMEA and PGME is used as the resist solvent. When another photoresist is used as the resist, propylene glycol monomethylether acetate, propylene glycol monomethylether, cyclohexanone or a liquid mixture of PGMEA and PGME, ethyl lactate, gamma-butyrolactone or N-methyl-2-pyrrolidone is used as the resist solvent.

When the first solvent is selected as the resist solvent, the switching valve V21 is opened and the switching valve V22 is closed in the switching section SW1, and when the second solvent is selected as the resist solvent, the switching valve 21 is closed and the switching valve V22 is opened in the switching section SW1. Further, the switching valve V23 is opened and the switching valve V24 is closed in the switching section SW2. The switching sections SW3, SW4 are kept in the states of steps S1, S2.

Subsequently, the discharge valve 15 is opened, and the resist solvent is pumped by the pump 27. Thus, the cleaning liquid in the pipe L4, the discharge valve 15 and the pipe L5 is pushed out by the resist solvent, and is discharged with the resist solvent from the discharge nozzle 16. As a result, the cleaning liquid in the pipe L4, the discharge valve 15 and the pipe L5 is replaced with the solvent. When a predetermined time period has elapsed since the discharge valve 15 is opened, the discharge valve 15 is closed, and the pumping of the resist solvent by the pump 27 is stopped. In the nitrogen gas replacement step of step S4, the discharge valve 15 is first opened, and the switching sections SW1 to SW4 are thereafter (0.5 second later, for example) controlled such that the nitrogen gas can be led to the discharge valve 15. Specifically, the switching valve V25 is closed and the switching valve V26 is opened in the switching section SW3. The switching sections SW1, SW2, SW4 are kept in the state of step S3. Thus, the resist solvent in the pipe L4, the discharge valve 15 and the pipe L5 is pushed out by the nitrogen gas, and is discharged from the discharge nozzle 16. As a result, the resist solvent in the pipe L4, the discharge valve 15 and the pipe L5 is replaced with the nitrogen gas. After a predetermined time period has elapsed, the switching valve V26 in the switching section SW3 is closed. The discharge valve 15 is thereafter (0.5 second later, for example) closed.

First, in the resist replacement step of step S5, the switching sections SW1 to SW4 are controlled such that the resist is led to the discharge valve 15 with the discharge valve 15 being closed. Specifically, the switching valve V3 is opened, and the switching valve V4 is closed in the switching section SW4. The switching sections SW1 to SW3 are kept in the state of step S4.

Subsequently, the discharge valve 15 is temporarily opened, and the resist is pumped by the pump 13 every time a predetermined time period elapses. As a result, the nitrogen gas in the pipe L4, the discharge valve 15 and the pipe L5 is replaced with the resist. The resist may be pumped by the pump 13 every time a predetermined time period elapses with the discharge valve 15 being kept released. Thus, the valve cleaning process is terminated. Thereafter, the normal resist coating process is performed.

In the present example, the resist solvent is replaced with the nitrogen gas after the cleaning liquid is replaced with the resist solvent. Thereafter, the nitrogen gas is replaced with the resist. If the cleaning liquid is not replaced with the resist solvent, and the component of the cleaning liquid stays remained at least part of the pipe L4, the discharge valve 15 and the pipe L5, the resist in which the component of the cleaning liquid is mixed is supplied to the substrate W during the following resist coating process. This causes a processing defect of the substrate W to occur. It is necessary to replace the cleaning liquid using a sufficient amount of the resist and make a remaining amount of the component of the cleaning liquid 0 in order to reliably prevent the component of the cleaning liquid from being mixed in the resist supplied to the substrate W. Because the resist is expensive, however, it is required to suppress the amount to be used to the minimum.

Therefore, the cleaning liquid is once replaced with the resist solvent. The resist solvent is markedly inexpensive as compared to the resist. Therefore, the replacement of the cleaning liquid is performed using a sufficient amount of the resist solvent, and the remaining amount of the component of the cleaning liquid can be made 0. Thereafter, the resist solvent is replaced with the nitrogen gas, and the nitrogen gas is replaced with the resist. As described above, because the resist solvent is same as the solvent included in the resist, the resist solvent is prevented from influencing the composition of the resist. Thus, a processing defect due to the resist solvent does not occur at the substrate W. Therefore, an occurrence of a processing defect of the substrate W can be sufficiently prevented while an amount of the resist to be used is inhibited.

(1-2-2) Second Example

Figure 3:
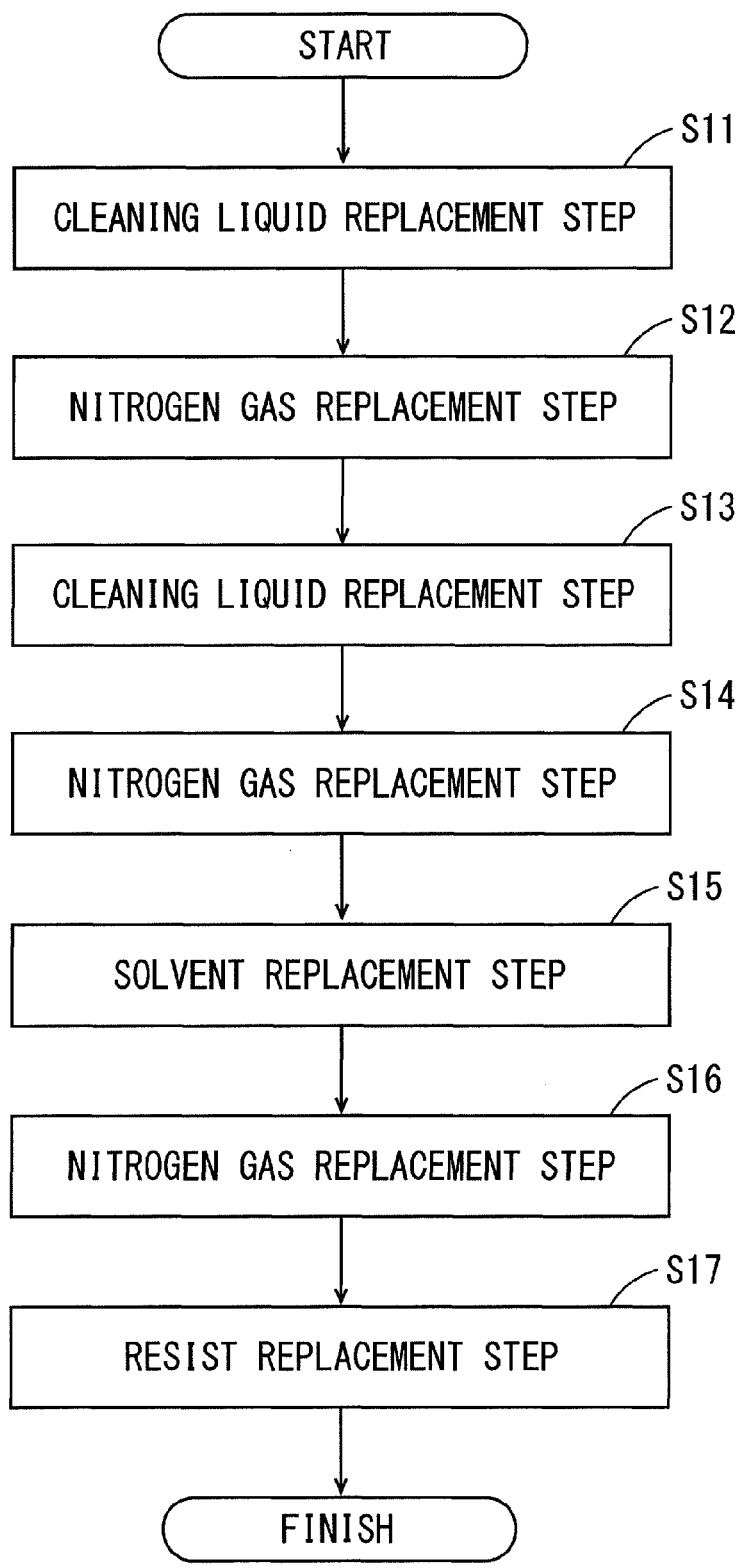
FIG. 3 is a flow chart for explaining a second example of the valve cleaning process.

FIG. 3 is a flow chart for explaining the second example of the valve cleaning process. In the second example, the cleaning liquid replacement step (step S11), the nitrogen gas replacement step (step S12), the cleaning liquid replacement step (step S13), the nitrogen gas replacement step (step S14), the solvent replacement step (step S15), the nitrogen gas replacement step (step S16) and the resist replacement step (step S17) are sequentially performed.

In the cleaning liquid replacement step of step S11, the similar operation to step S1 of FIG. 2 is performed, and the resist in the pipe L4, the discharge valve 15 and the pipe L5 is replaced with the cleaning liquid. In the nitrogen gas replacement step of step S12, the discharge valve 15 is first opened, and the switching sections SW1 to SW4 are thereafter (0.5 second later, for example) controlled such that the nitrogen gas can be led to the discharge valve 15. Specifically, the switching valve V25 is closed and the switching valve V26 is opened in the switching section SW3. The switching sections SW1, SW2, SW4 are kept in the state of step S11. Thus, the cleaning liquid in the pipe L4, the discharge valve 15 and the pipe L5 is pushed out by the nitrogen gas, and is discharged from the discharge nozzle 16. As a result, the cleaning liquid in the pipe L4, the discharge valve 15 and the pipe L5 is replaced with the nitrogen gas. The switching valve V26 in the switching section SW3 is closed after a predetermined time period has elapsed. Thereafter (0.5 second later, for example), the discharge valve 15 is closed.

In the cleaning liquid replacement step of step S13, the similar operation to step S11 is performed, and the nitrogen gas in the pipe L4, the discharge valve 15 and the pipe L5 is replaced with the cleaning liquid. In the nitrogen gas replacement step of step S14, the similar operation to the step S12 is performed, and the cleaning liquid in the pipe L4, the discharge valve 15 and the pipe L5 is replaced with the nitrogen gas.

In this manner, the cleaning liquid replacement step and the nitrogen gas replacement step are alternately performed a number of times, so that the cleaning of the discharge valve 15 by the cleaning liquid and the drying of the discharge valve 15 by the nitrogen gas are repeated. Thus, a solid matter that adheres to the discharge valve 15 can be removed in steps. While the cleaning liquid replacement step and the nitrogen gas replacement step are respectively performed two times in the present example, they may be respectively performed more than three times.

In the solvent replacement step of step S15, the similar operation to step S3 of FIG. 2 is performed, and the nitrogen gas in the pipe L4, the discharge valve 15 and the pipe L5 is replaced with the resist solvent. In the nitrogen gas replacement step of step S16, the similar operation to step S4 of FIG. 2 is performed, and the resist solvent in the pipe L4, the discharge valve 15 and the pipe L5 is replaced with the nitrogen gas. In the resist replacement step of step S17, the similar operation to step S5 of FIG. 2 is performed, and the nitrogen gas in the pipe L4, the discharge valve 15 and the pipe L15 is replaced with the resist. Thus, the valve cleaning process is terminated.

(1-3) Control System

Figure 4:
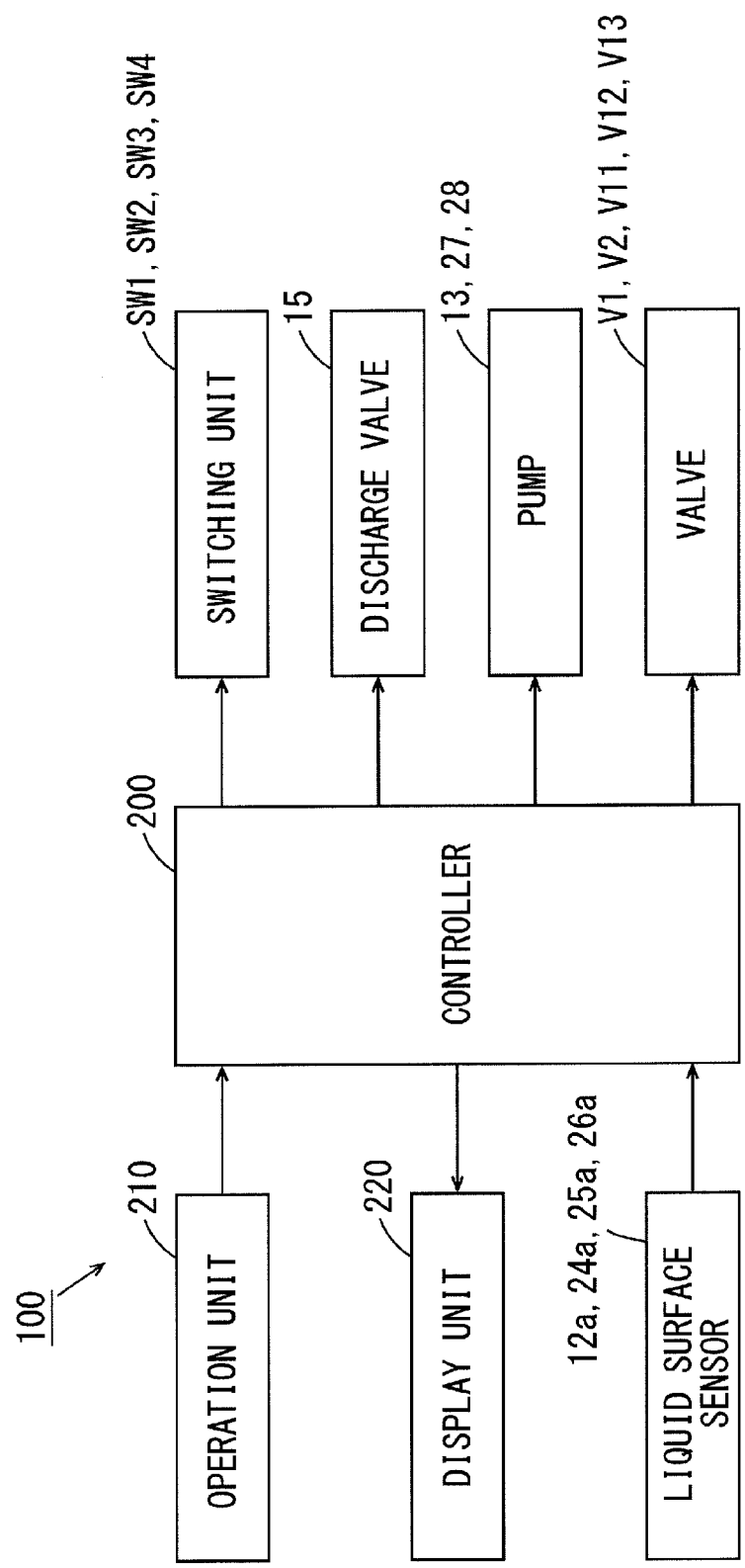
FIG. 4 is a block diagram for explaining the control system of the substrate processing apparatus.

FIG. 4 is a block diagram for explaining the control system of the substrate processing apparatus 100. As shown in FIG. 4, the substrate processing apparatus 100 according to the present embodiment includes a controller 200, an operation unit 210 and a display unit 220. The controller 200 includes a CPU (Central Processing Unit) and a memory, or microcomputer, for example. The operation unit 210 includes a key board and a mouse, for example, and the display unit 220 includes a liquid crystal display, for example. At least part of the operation unit 210 and at least part of the display unit 220 may be integrally provided as a touch-screen, for example.

The user performs various settings with regard to the resist coating process and the valve cleaning process by operating the operation unit 210. Further, the operation unit 210 includes a start instruction unit 221 (FIG. 6) for starting each cleaning step of the valve cleaning process. Details of the start instruction unit 221 will be described below. The display unit 220 displays the content of various settings, the operation state and the like with regard to the resist coating process and the valve cleaning process. The controller 200 controls the switching sections SW1, SW2, SW3, SW4, the discharge valve 15, the pumps 13, 27, 28 and the valves V1, V2, V11, V12, V13 based on the contents of settings at the operation unit 210.

Further, the detection results by the liquid surface sensors 12a, 24a, 25a, 26a are supplied to the controller 200. The controller 200 determines based on those detection results whether or not the chemical liquid bottle 11, the solvent bottles 21, 22 and the cleaning liquid bottle 23 are empty. In a case in which the chemical liquid bottle 11, the solvent bottles 21, 22 or the cleaning liquid bottle 23 is empty, the controller 200 generates the bottle exchange warning that prompts the exchange of them. For example, the controller 200 activates a buzzer (not shown) and displays a message that prompts the exchange of bottles on the display unit 220 as the bottle exchange warning.

In a case in which the solvent bottles 21, 22 or the cleaning liquid bottle 23 is empty, the controller 200 closes the discharge valve 15 in the chemical liquid processing section 10 by which the solvent or the cleaning liquid is supplied at that time point, and stops the pumping of the solvent by the pump 27 or the pumping of the cleaning liquid by the pump 28. In a case in which the chemical liquid bottle 11 is empty, the control unit 200 closes the discharge valve 15 included in the common chemical liquid processing section 10 to the chemical liquid bottle 11, and stops the pumping of the resist by the pump 13. After the exchange of each bottle, the controller 200 restarts these operation.

(1-4) Setting of Valve Cleaning Process

A setting screen for performing various settings with regard to the valve cleaning process (hereinafter referred to as a cleaning setting screen) is displayed in the display unit 220. FIG. 5 is a diagram showing one example of the cleaning setting screen.

As shown in FIG. 5, the cleaning setting screen includes a plurality of setting items. In the example of FIG. 5, the cleaning setting screen includes "cleaning liquid replacement time period", "discharge valve opening/closing interval", "solvent replacement time period", "number of resist replacement", "type of solvent" and "nitrogen gas discharge time period" as setting items.

"Cleaning liquid replacement time period" is a length of time period in which the discharge valve 15 is opened and the cleaning liquid is pumped by the pump 28 in the cleaning liquid replacement step (step S1 of FIG. 2 and steps S11, S13 of FIG. 3). "Discharge valve opening/closing interval" is a time interval between which the release of the discharge valve 15 and the pumping of the cleaning liquid by the pump 28 are performed in the valve opening/closing step (step S2 of FIG. 2).

"Solvent replacement time period" is a length of time period in which the discharge valve 15 is opened and the resist solvent is pumped by the pump 28 in the solvent replacement step (step S3 of FIG. 2 and step S15 of FIG. 3). "Number of resist replacement" is the number of times, which the release of the discharge valve 15 and the pumping of the resist by the pump 13 are performed in the resist replacement step (step S5 of FIG. 2 and step S17 of FIG. 3).

"Type of solvent" is a type of solvent to be used as the resist solvent in the solvent replacement step (step S3 of FIG. 2 and step S15 of FIG. 3). "Nitrogen gas discharge time period" is a length of time period in which the nitrogen gas is led to the discharge valve 15 in the nitrogen gas replacement step (step S4 of FIG. 2 and steps S12, S14, S16 of FIG. 3).

The user operates the operation unit 210, and performs the setting of each setting item (entry of a numerical value or designation of the solvent) for every discharge nozzle 16. In the example of FIG. 5, the setting for each setting item is performed for each of the eight discharge nozzles 16. In this case, the one discharge nozzle 16 corresponds to the one discharge valve 15.

(1-5) Start Instruction Unit

Figure 6:
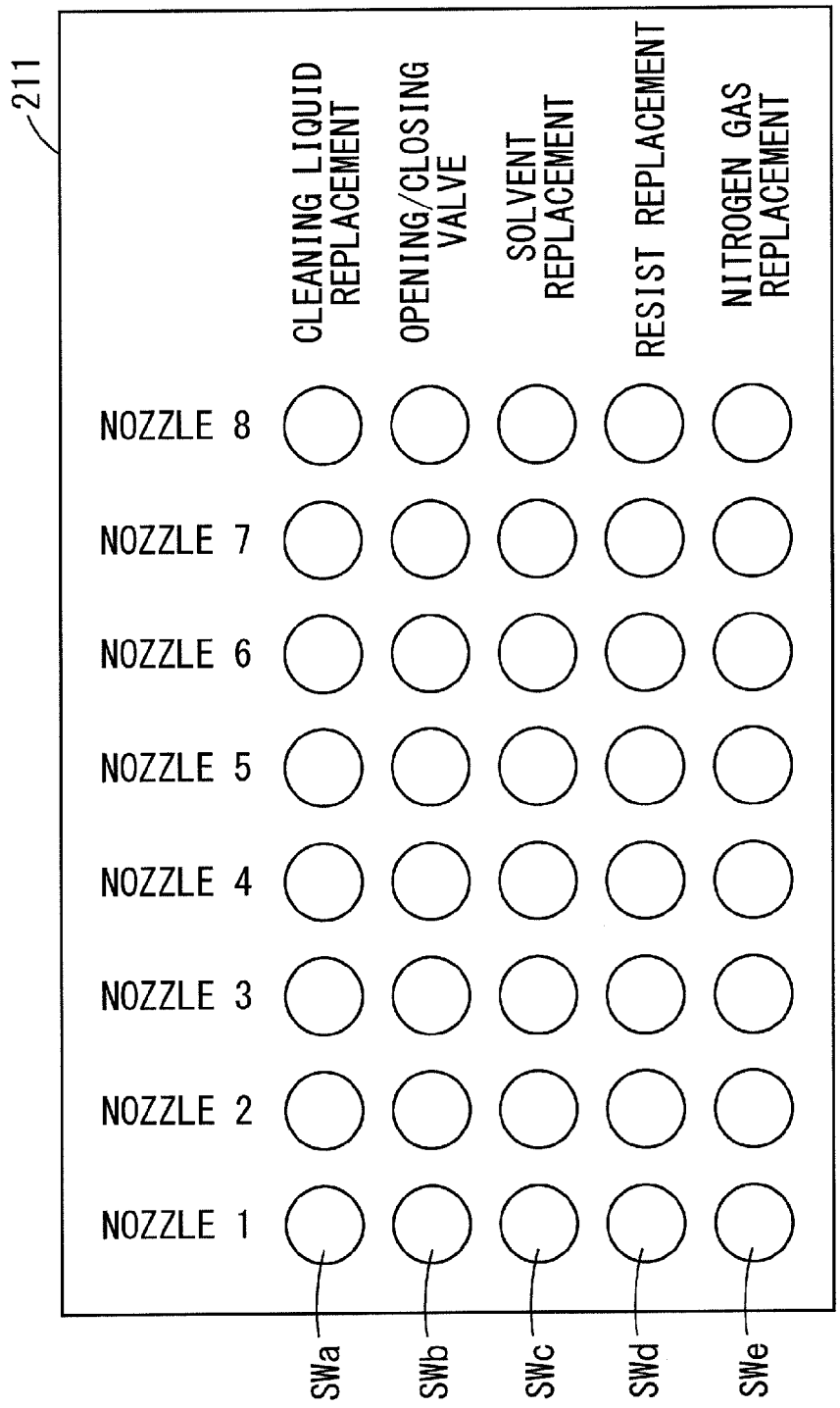
FIG. 6 is a diagram showing one example of a start instruction unit of an operation unit.

FIG. 6 is a diagram showing one example of the start instruction unit 211 of the operation unit 210 (FIG. 4). As shown in FIG. 6, a cleaning liquid replacement switch SWa, a valve opening/closing switch SWb, a solvent replacement switch SWc, a resist replacement switch SWd and a nitrogen gas replacement switch SWe are respectively provided in the start instruction unit 211 to correspond to each of the plurality of (eight in the present example) discharge nozzles 16, that is, to correspond to each of the plurality of discharge valves 15. The start instruction unit 211 may be hardware provided independently, or may be an image displayed on the touch-screen.

The user selectively presses the cleaning liquid replacement switch SWa, the valve opening/closing switch SWb, the solvent replacement switch SWc, the resist replacement switch SWd and the nitrogen gas replacement switch SWe according to the purpose. Each cleaning liquid replacement switch SWa is pressed to start the cleaning liquid replacement step at the corresponding discharge valve 15. Each valve opening/closing switch SWb is pressed to start the valve opening/closing step at the corresponding discharge valve 15. Each solvent replacement switch SWc is pressed to start the solvent replacement step at the corresponding discharge valve 15. Each resist replacement switch SWd is pressed to start the resist replacement step at the corresponding discharge valve 15. Each nitrogen gas replacement switch SWe is pressed to start the nitrogen gas replacement step at the corresponding discharge valve 15. Hereinafter, the cleaning liquid replacement switch SWa, the valve opening/closing switch SWb, the solvent replacement switch SWc, the resist replacement switch SWd and the nitrogen gas replacement switch SWe are collectively termed as a switch SWx.

The controller 200 (FIG. 4) determines whether or not the cleaning step (hereinafter referred to as a designated cleaning step) that corresponds to the pressed switch SWx is to be performed based on predetermined interlock information. Details of the interlock information will be described below. In a case in which the designated cleaning step is to be performed, the controller 200 enables the operation of the switch SWx, and controls each section in the corresponding chemical liquid processing section 10 and the cleaning processing section 20 based on the contents set in the cleaning setting screen of FIG. 5. On the other hand, in a case in which the designated cleaning step is not to be performed, the controller 200 disables the operation of the switch SWx. In this case, the disabling of the operation of the switch SWx may be displayed in the display unit 220 (FIG. 4).

Further, the controller 200 may disable the operation of each switch SWx at the time of the exchange of the chemical liquid bottle 11, the solvent bottles 21, 22 or the cleaning liquid bottle 23. Alternatively, also in a case in which an unforeseen circumstance such as electric power failure occurs, the controller 200 may disable the operation of each switch SWx.

Each switch SWx is configured to light, blink and go out according to the execution state of the corresponding cleaning step. Specifically, each switch SWx blinks during the execution of the corresponding cleaning step. When the corresponding cleaning step is terminated, each switch SWx lights. Thereafter, when another cleaning step is started for the target discharge valve 15, the lighting switch SWx goes out.

(1-6) Interlock Information
(1-6-1) First Example
FIG. 7 is a diagram for explaining the first example of the interlock information. The resist, the cleaning liquid, the solvent or the nitrogen gas is present in the pipe L4, the discharge valve 15 and the pipe L5 of FIG. 1 according to the immediately preceding cleaning step. Hereinafter, those fluids present in the discharge valve 15 are referred to as inside-valve fluids. In the first example, possibility and impossibility of execution of the designated cleaning step is determined according to the inside-valve fluid. In FIG. 7, "○" indicates that the designated cleaning step is to be performed, and "x" indicates that the designated cleaning step is not to be performed.

In the example of FIG. 7, in a case in which the designated cleaning step is the cleaning liquid replacement step or the solvent replacement step, the designated cleaning step is performed whichever the inside-valve fluid is of the resist, the cleaning liquid, the solvent and the nitrogen gas. In a case in which the designated cleaning step is the valve opening/closing step, if the inside-valve fluid is the resist, the solvent or the nitrogen gas, the designated cleaning step is not performed. Thus, the valve opening/closing step is prevented from being wastefully performed with the cleaning liquid not being supplied to the discharge valve 15.

In a case in which the designated cleaning step is the resist replacement step, if the inside-valve fluid is the resist or the cleaning liquid, the designated cleaning step is not performed. Thus, an occurrence of a processing defect of the substrate W can be inhibited while the expensive resist is inhibited from being wastefully consumed. In a case in which the designated cleaning step is the nitrogen gas replacement step, if the inside-valve fluid is the resist, the designated cleaning step is not performed. Thus, the cleaning efficiency of the discharge valve 15 can be improved.

(1-6-2) Second Example
As described above, in the present embodiment, the common cleaning processing section 20 is provided for the plurality of discharge valves 15. Therefore, it may not be possible to appropriately execute a desired cleaning step depending on the execution state of the cleaning step for each discharge valve 15. For example, in a case in which the cleaning liquid replacement step or the solvent replacement step is in progress for the one discharge valve 15, the cleaning liquid replacement step and the solvent replacement step cannot be appropriately performed on another discharge valve 15. On the other hand, the resist replacement step is independently performed in each chemical liquid processing section 10. Therefore, the resist replacement step for the one discharge valve 15 does not influence each cleaning step for another discharge valve 15. In the second example, the possibility and impossibility of execution of the designated cleaning step is determined according to the execution state of the cleaning step for each discharge valve 15.

FIG. 8 is a diagram for explaining the second example of the interlock information. In FIG. 8, "○" indicates that the designated cleaning step is to be performed in both cases in which the cleaning step in progress and the designated cleaning step correspond to the common discharge valve 15, and the cleaning step in progress and the designated cleaning step in progress correspond to different discharge valves 15. "Δ" indicates that the designated cleaning step is to be performed only in a case in which the cleaning step in progress and the designated cleaning step correspond to different discharge valves 15. "x" indicates that the designated cleaning step is not to be performed.

In a case in which the cleaning step in progress and the designated cleaning step correspond to the common discharge valve 15, if the designated cleaning step is to be performed (in the case of "○"), the cleaning step in progress is forcibly terminated, and the designated cleaning step is started. Further, in a case in which the cleaning step in progress and the designated cleaning step correspond to different discharge valves 15, if the designated cleaning step is to be performed (in the case of "○" or "Δ"), these cleaning steps are simultaneously performed.

In the example of FIG. 8, in a case in which the designated cleaning step is the cleaning liquid replacement step, if the cleaning liquid replacement step, the solvent replacement step or the nitrogen gas replacement step is in progress for any one of the discharge valves 15, the designated cleaning step is not performed. Further, if the resist replacement step is in progress for the discharge valve 15 that corresponds to the designated cleaning step, the designated cleaning step is not performed.

In a case in which the designated cleaning step is the valve opening/closing step, if the solvent replacement step or the nitrogen gas replacement step is in progress for any one of the discharge valves 15, the designated cleaning step is not performed. Further, if the cleaning liquid replacement step, the valve opening/closing step or the resist replacement step is in progress for the discharge valve 15 that corresponds to the designated cleaning step, the designated cleaning step is not performed. Thus, the valve opening/closing step is prevented from being wastefully performed with the cleaning liquid not being supplied to the discharge valve 15.

In a case in which the designated cleaning step is the solvent replacement step, if the cleaning liquid replacement step, the valve opening/closing step, the solvent replacement step or the nitrogen gas replacement step is in progress for any one of the discharge valves 15, the designated cleaning step is not performed. Further, if the resist replacement step is in progress for the discharge valve 15 that corresponds to the designated cleaning step, the designated cleaning step is not performed.

In a case in which the designated cleaning step is the resist replacement step, if the cleaning liquid replacement step, the valve opening/closing step, the solvent replacement step, the resist replacement step or the nitrogen gas replacement step is in progress for the discharge valves 15 that corresponds to the designated cleaning step, the designated cleaning step is not performed.

In a case in which the designated cleaning step is the nitrogen gas replacement step, if the cleaning liquid replacement step, the valve opening/closing step or the solvent replacement step is in progress for any one of the discharge valves 15, the designated cleaning step is not performed. Further, if the resist replacement step is in progress for the discharge valve 15 that corresponds to the designated cleaning step, the designated cleaning step is not performed.

(1-7) Effects

In the substrate processing apparatus 100 according to the present embodiment, the valve cleaning process is performed on the discharge valve 15 in each chemical liquid processing section 10. During the valve cleaning process, the cleaning liquid, the solvent and the nitrogen gas are selectively led to the flow path range FP1 that includes the discharge valve 15 in each chemical liquid processing section 10 from the cleaning processing section 20. In this case, because the cleaning liquid is not led to the filter 14, the filter 14 can be continuously used even after the valve cleaning process. Thus, the discharge valve 15 provided on the route that leads the resist to the discharge nozzle 16 can be cleaned while complication of operation and an increase in cost due to the exchange of the filter 14 are inhibited.

In the valve cleaning process, the plurality of cleaning steps are selectively performed. As one example, the cleaning liquid replacement step and the valve opening/closing step are sequentially performed. In this case, the opening and closing of the discharge valve 15 are repeated while the cleaning liquid is supplied to the discharge valve 15. Thus, a solid matter that adheres to the discharge valve 15 can be effectively stripped. As a result, the discharge valve 15 can be efficiently cleaned. Further, as another example, the cleaning liquid replacement step and the nitrogen gas replacement step are alternately performed a number of times. In this case, the cleaning and drying of the discharge valve 15 are repeated. Thus, a solid matter that adheres to the discharge valve 15 can be removed in steps. As a result, the discharge valve 15 can be efficiently cleaned.

Thus, the solvent replacement step, the nitrogen gas replacement step and the resist replacement step are sequentially performed after a solid matter is removed from the discharge valve 15. In this case, the cleaning liquid is replaced with the inexpensive solvent, so that a residue of the cleaning liquid can be prevented at a low cost. Further, because the solvent made of the same component or the same type of component as the solvent included in the resist is used, the solvent is prevented from influencing the composition of the resist. Thus, a processing defect does not occur at the substrate due to the solvent. In particular, the solvent that includes the same component as the solvent included in the resist is used, so that its effect is significant. Thus, a processing defect of the substrate W can be reliably prevented while the amount of the expensive resist to be used is inhibited.

Further, in the present embodiment, the valve cleaning process is performed only on the selected chemical liquid processing section 10 of the plurality of chemical liquid processing sections 10 based on the operation of the start instruction unit 211 by the user. In this case, in the unselected chemical liquid processing section 10, the resist coating process can be continuously performed. Thus, the target discharge nozzle 16 can be suitably cleaned while a decrease in throughput is inhibited.

(2) Second Embodiment

Figure 9:
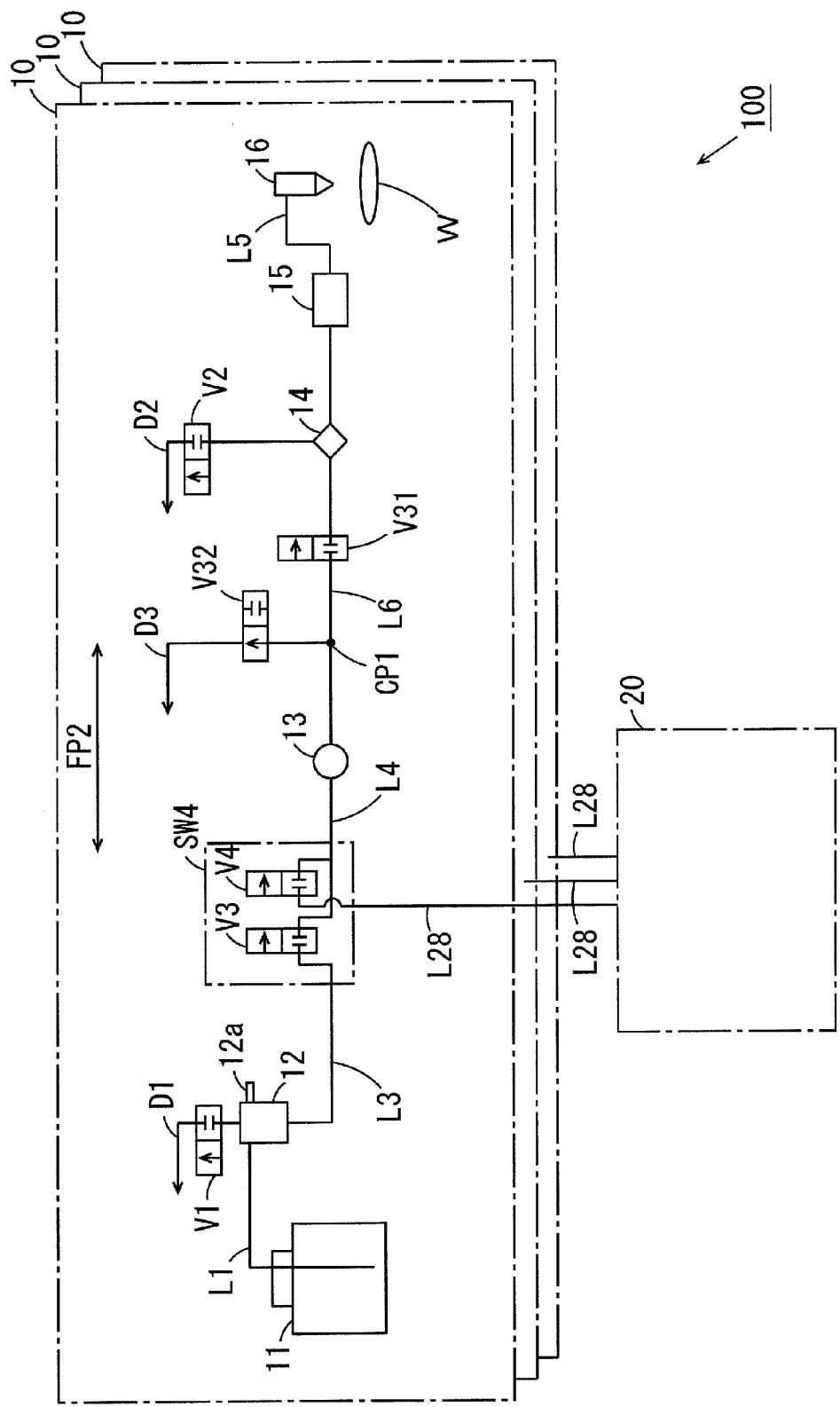
FIG. 9 is a diagram showing the configuration of the substrate processing apparatus according to a second embodiment of the present invention.

FIG. 9 is a diagram showing the configuration of a substrate processing apparatus 100 according to the second embodiment of the present invention. The substrate processing apparatus 100 of FIG. 9 has a plurality of chemical liquid processing sections 10 and a cleaning processing section 20 similarly to the substrate processing apparatus 100 of FIG. 1. The configuration of the cleaning processing section 20 of FIG. 9 is similar to the configuration of the cleaning processing section 20 of FIG. 1. The configuration of each chemical liquid processing section 10 of FIG. 9 is different from the configuration of each chemical liquid processing section 10 of FIG. 1 in following points.

In each chemical liquid processing section 10 of FIG. 9, a pipe L3 and a pipe L28 join each other at a further upstream position than a pump 13, and are connected to one end of a pipe L4. The pump 13 is inserted into the pipe L4. Thus, the cleaning liquid, the solvent and the nitrogen gas can be selectively led to the pump 13 from the cleaning processing section 20 through the pipe L28 and the pipe L4.

The other end of the pipe L4 is connected to one end of a discharge pipe D3 and one end of a pipe L6 at a branch point CP1. The other end of the discharge pipe D3 extends externally of the chemical liquid processing section 10. A switching valve V32 is inserted into the discharge pipe D3. The other end of the pipe L6 is connected to a discharge valve 15. A switching valve V31 and a filter 14 are sequentially inserted into the pipe L6 from an upstream position.

In the present embodiment, a flow path in the pipe L4 and the pump 13 is a predetermined flow path range FP2. The cleaning liquid, the solvent, the nitrogen gas and the resist are selectively led to the flow path range FP2 that includes the pump 13, so that a cleaning process of the pump 13 (hereinafter referred to as a pump cleaning process) is performed. In the pump cleaning process, a plurality of cleaning steps are selectively performed similarly to the examples of FIGS. 2 and 3.

In the cleaning liquid replacement step, the cleaning liquid is led to the pump 13 from the cleaning processing section 20. In the solvent replacement step, the first or second solvent is led to the pump 13 from the cleaning processing section 20. In the nitrogen gas replacement step, the nitrogen gas is led to the pump 13 from the cleaning processing section 20. In the resist replacement step, the resist is led to the pump 13 from the chemical liquid bottle 11. The valve opening/closing step is not performed in the pump cleaning process.

In each cleaning step, each section in the cleaning processing section 20 operates similarly to the above-mentioned valve cleaning process. Further, a switching valve V31 is closed in the cleaning liquid replacement step, the solvent replacement step and the nitrogen gas replacement step. In this case, a switching valve V32 is opened, so that the cleaning liquid, the solvent and the nitrogen gas led to the pump 13 are discharged from the chemical liquid processing section 10 through the discharge pipe D3. In the resist replacement step, the switching valve V31 is opened and the switching valve V32 is closed, and the pump 13 and the discharge valve 15 operate similarly to the above-mentioned valve cleaning process. Thus, the resist purified by the filter 14 is led to a discharge nozzle 16.

In the present embodiment, a solid matter that adheres to the pump 13 is effectively removed by the pump cleaning process. Further, the cleaning liquid led to the pump 13 is discharged through the discharge pipe D3 at a further upstream position than the filter 14. Therefore, the cleaning liquid is not led to the filter 14. Thus, it is not necessary to exchange the filter 14 after the pump cleaning process. As a result, the pump 13 provided on the route that leads the resist to the discharge nozzle 16 can be cleaned while complication of operation and an increase in cost are inhibited.

While the substrate processing apparatus 100 according to the present embodiment is configured such that the cleaning liquid, the solvent and the nitrogen gas are selectively led to the pump 13 through the pipe L28 and the pipe L4 from the cleaning processing section 20, the invention is not limited to this. For example, the substrate processing apparatus 100 may be configured such that a pipe L1 and the pipe L28 join each other at a further upstream position than a buffer tank 12 and the cleaning liquid, the solvent and the nitrogen gas are selectively led to the buffer tank 12 and the pump 13 from the cleaning processing section 20 through the pipe L28 and the pipes L1, L3, L4. In this case, the buffer tank 12 and the pump 13 can be cleaned.

(3) Third Embodiment

Figure 10:
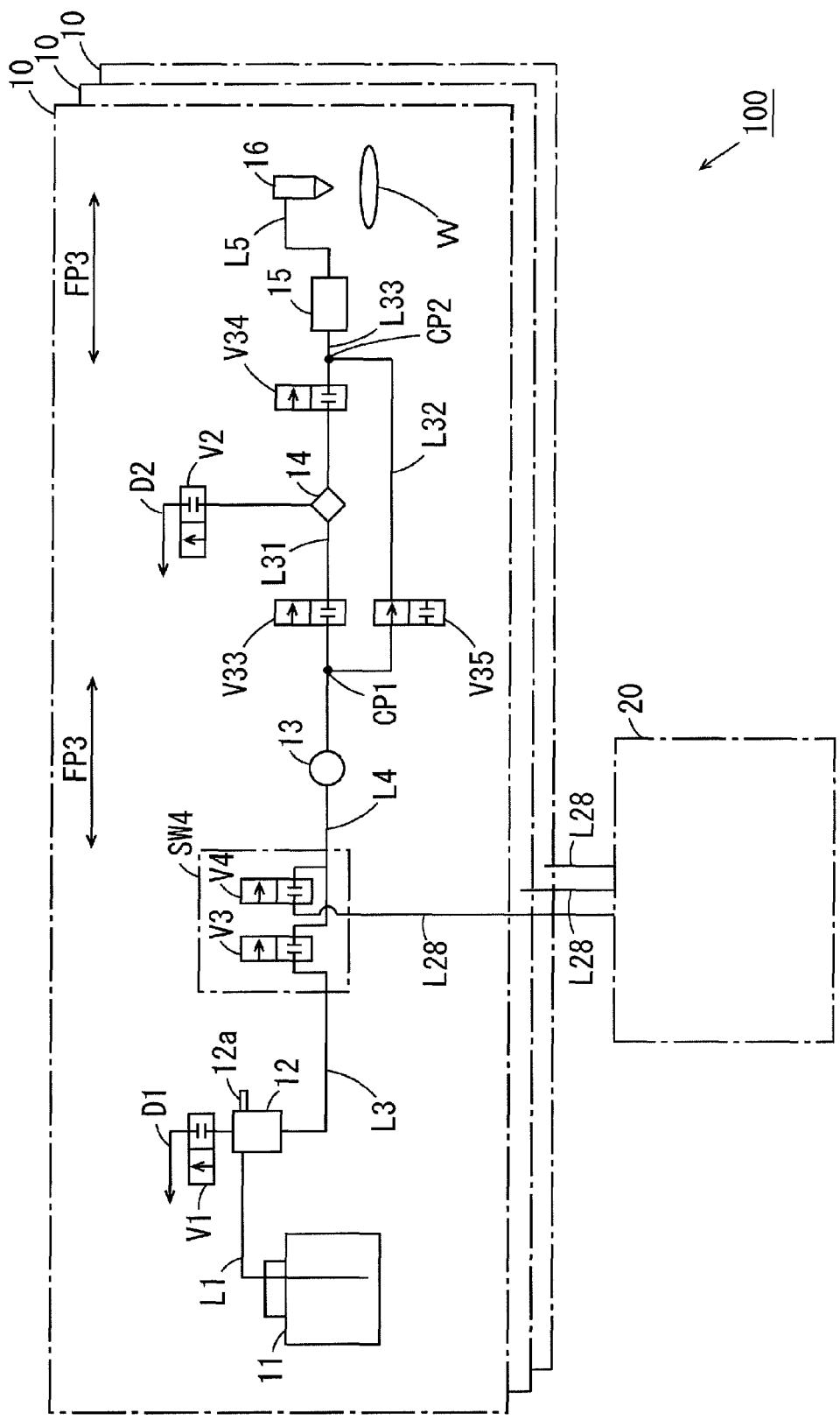
FIG. 10 is a diagram showing the configuration of the substrate processing apparatus according to a third embodiment of the present invention.

FIG. 10 is a diagram showing the configuration of a substrate processing apparatus 100 according to a third embodiment of the present invention. With regard to the substrate processing apparatus 100 of FIG. 10, difference from the substrate processing apparatus 100 of FIG. 9 will be described.

In the substrate processing apparatus 100 of FIG. 10, another end of a pipe L4 is connected to one end of a pipe L31 and one end of a pipe L32 at a branch point CP1. Further, the other end of the pipe L31 and the other end of the pipe L32 are connected to one end of a pipe L33 at a branch point CP2. The other end of the pipe L33 is connected to a discharge valve 15. A switching valve V33, a filter 14 and a switching valve V34 are sequentially inserted into the pipe L31 from an upstream position. A switching valve V35 is inserted into a pipe L32.

In the present embodiment, a flow path in the pipe L4, a pump 13, the pipe L33, the discharge valve 15 and a pipe L5 is a predetermined flow path range FP3. The cleaning liquid, the solvent, the nitrogen gas and the resist are selectively led to a flow path range FP3 that includes the pump 13 and the discharge valve 15, so that a pump cleaning process and a valve cleaning process are simultaneously performed. Further, a valve opening/closing step can be performed similarly to the above-mentioned first embodiment.

In each cleaning step, each section in the cleaning processing section 20, and the pump 13 and the discharge valve 15 in each chemical liquid processing section 10 operate similarly to the valve cleaning process of the above-mentioned first embodiment. Further, in the cleaning liquid replacement step, the solvent replacement step and the nitrogen gas replacement step, switching valves V33, V34 are closed and a switching valve V35 is opened. In this case, the cleaning liquid, the solvent and the nitrogen gas led to the pump 13 are led to the discharge valve 15 through the pipe L32. In the resist replacement step, the switching valves V33, V34 are opened, and the switching valve V35 is closed. Thus, the resist purified by the filter 14 is led to a discharge nozzle 16.

In the present embodiment, a solid matter that adheres to the pump 13 and the discharge valve 15 is effectively removed by the pump cleaning process and the valve cleaning process. Further, the cleaning liquid led to the pump 13 is led to the discharge valve 15 through the pipe L32. Thus, the cleaning liquid is not led to the filter 14. Therefore, it is not necessary to exchange the filter 14 after the pump cleaning process and the valve cleaning process. As a result, the pump 13 and the discharge valve 15 provided on the route that leads the resist to the discharge nozzle 16 can be cleaned while complication of operation and an increase in cost are inhibited.

(4) Other Embodiments (4-1)

While a process is performed on the substrate W by the color resist in the above-mentioned embodiment, the process may be performed on the substrate W by another chemical liquid. For example, the normal resist, a processing liquid for an SOD (Spin On Dielectric) film, a processing liquid for an SOG (Spin On Glass) film, a polyamic acid solution or a luminescent material for organic EL (Electro-Luminescence) may be used as the chemical liquid, and the process may be performed on the substrate W using them. Even in that case, the similar effect to the above-mentioned embodiment is obtained. In particular, in a case in which a chemical liquid made of a resin compound and a solvent compound is used, its effect is significant.

(4-2)

While each cleaning step of the valve cleaning process and the pump cleaning process is started by the operation of the start instruction unit 211 by the user in the above-mentioned embodiment, the invention is not limited to this. For example, the order of the plurality of cleaning steps and their starting time points are stored in advance, and the plurality of cleaning steps may be sequentially automatically performed.

(4-3)

While two types of solvents are used in the above-mentioned embodiment, the invention is not limited to this. For example, in a case in which one type of the chemical liquid is used, only one type of the solvent may be used.

Further, in a case in which not less than three types of the chemical liquids are used, not less than three types of the solvents may be used.

(4-4)

While the solvent replacement step is performed before the resist replacement step during the valve cleaning process and the pump cleaning process in the above-mentioned embodiment, the invention is not limited to this. For example, in a case in which an inexpensive chemical liquid is used, or in a case in which the mixing of a compound of the cleaning liquid in the chemical liquid does not cause a processing defect of the substrate W, the solvent replacement step does not have to be performed.

(4-5)

While the common cleaning processing section 20 is provided for the plurality of chemical liquid processing sections 10 in the above-mentioned embodiment, the invention is not limited to this. Only one chemical liquid processing section 10 may be provided. Alternatively, the plurality of cleaning processing sections 20 that respectively correspond to the plurality of chemical liquid processing sections 10 may be provided.

(5) Correspondences between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiment, the chemical liquid processing section 10 is an example of a chemical liquid processing section, the cleaning processing section 20 is an example of a cleaning processing section, the controller 200 is an example of a controller, the chemical liquid bottle 11 is an example of a chemical liquid storage, the discharge nozzle 16 is an example of a discharge nozzle, the pipes L3, L4, L5, L6 are examples of a first pipe, the pump 13 is an example of a supply device, the discharge valve 15 is an example of a flow path opening/closing unit, the filter 14 is an example of a filter, the pipe L24 is an example of a second pipe, the pipe L26 is an example of a third pipe, the pipes L21, L22, L23 are examples of a fourth pipe, the switching sections SW1, SW2, SW3, SW4 and the switching valves V31 to V35 are examples of a switching section, the pump 28 is an example of a pumping device and the operation unit 210 is an example of an operation unit.

As each of constituent elements recited in the claims, each various other elements having configurations or functions described in the claims can be also used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

INDUSTRIAL APPLICABILITY

The present invention can be effectively utilized for processing various types of substrates.

We claim:

1. A substrate processing apparatus comprising:
a chemical liquid processing section in which a process is performed on a substrate by a chemical liquid;
a cleaning processing section in which a cleaning process is performed on the chemical liquid processing section; and
a controller configured to control the chemical liquid processing section and the cleaning processing section, wherein
the chemical liquid processing section includes
a chemical liquid storage configured to store the chemical liquid that includes a solvent,
a discharge nozzle configured to discharge the chemical liquid,
a first pipe for leading the chemical liquid stored in the chemical liquid storage to the discharge nozzle,
a supply device provided at the first pipe and configured to supply the chemical liquid stored in the chemical liquid storage to the discharge nozzle through the first pipe,
a flow path opening/closing unit provided at a portion of the first pipe at a further downstream position than the supply device and configured to be capable of opening and closing a flow path in the first pipe, and
a filter provided at a portion of the first pipe that is located at a further downstream position than the supply device and at a further upstream position than the flow path opening/closing unit, wherein
the cleaning processing section includes
a second pipe for leading a cleaning liquid to the first pipe, the cleaning liquid including a component for cleaning away solid matter,
a fourth pipe for leading to the first pipe a replacement solvent that includes a same component or a same type of component as a solvent included in the chemical liquid stored in the chemical liquid storage so as not to affect a composition of the chemical liquid, and
a switching unit configured to be capable of switching a flow path in the first, second and fourth pipes such that the chemical liquid, the cleaning liquid and the replacement solvent are selectively led to a predetermined flow path range of the first pipe and the cleaning liquid does not pass through the filter, and
the controller is configured to control the switching unit such that the replacement solvent is led to the flow path range after the solid matter adhering to the flow path range is cleaned away by the cleaning liquid led to the flow path range, so that the cleaning liquid in the flow path range is replaced with the replacement solvent, and the chemical liquid is led to the flow path range after the replacement solvent is led to the flow path range.

2. The substrate processing apparatus according to claim 1, wherein
the flow path opening/closing unit is provided in the flow path range.

3. The substrate processing apparatus according to claim 2, wherein
the controller controls the switching unit and the flow path opening/closing unit such that the flow path opening/closing unit is successively opened and closed with the cleaning liquid being led to the flow path opening/closing unit.

4. The substrate processing apparatus according to claim 1, wherein
the supply device is provided in the flow path range.

5. The substrate processing apparatus according to claim 1, wherein
the plurality of chemical liquid processing sections are provided,
the substrate processing apparatus further comprising an operation unit operated by a user in order to designate at least one chemical liquid processing section of the plurality of chemical liquid processing sections, wherein the controller controls the cleaning processing section to selectively perform the cleaning process on the designated chemical liquid processing section of the plurality of chemical processing sections based on operation of the operation unit.

6. A substrate processing apparatus comprising:
a chemical liquid processing section in which a process is performed on a substrate by a chemical liquid;
a cleaning processing section in which a cleaning process is performed on the chemical liquid processing section; and
a controller configured to control the chemical liquid processing section and the cleaning processing section, wherein
the chemical liquid processing section includes
a chemical liquid storage configured to store the chemical liquid,
a discharge nozzle configured to discharge the chemical liquid,
a first pipe for leading the chemical liquid stored in the chemical liquid storage to the discharge nozzle,
a supply device provided at the first pipe and configured to supply the chemical liquid stored in the chemical liquid storage to the discharge nozzle through the first pipe,
a flow path opening/closing unit provided at a portion of the first pipe at a further downstream position than the supply device and configured to be capable of opening and closing a flow path in the first pipe, and
a filter provided at a portion of the first pipe that is located at a further downstream position than the supply device and at a further upstream position than the flow path opening/closing unit,
the cleaning processing section includes
a second pipe for leading a cleaning liquid to the first pipe, and
a switching unit configured to be capable of switching the flow path in the first and second pipes such that the chemical liquid and the cleaning liquid are selectively led to the flow path opening/closing unit and the cleaning liquid does not pass through the filter, and
the controller is configured to control the switching unit and the flow path opening/closing unit such that the flow path opening/closing unit is successively opened and closed with the cleaning liquid being led to the flow path opening/closing unit,
the cleaning processing section further includes a pumping device configured to pump the cleaning liquid through the second pipe, and
the controller is configured to control the pumping device such that the cleaning liquid is pumped at a time of opening the flow path opening/closing unit during a period in which the flow path opening/closing unit is successively opened and closed with the cleaning liquid being led to the flow path opening/closing unit.

7. The substrate processing apparatus according to claim 6, wherein
a plurality of chemical processing sections are provided, the substrate processing apparatus further comprising an operation unit operated by a user in order to designate at least one chemical liquid processing section of the plurality of chemical liquid processing sections, wherein the controller is configured to control the cleaning processing section to selectively perform the cleaning process on the designated chemical processing section of the plurality of chemical processing sections based on operation of the operation unit.

8. The substrate processing apparatus according to claim 1, wherein
the flow path range includes the supply device,
the second pipe is configured to lead the cleaning liquid to a portion of the first pipe at a further upstream position than the supply device,
the cleaning processing section further includes a fifth pipe for discharging the cleaning liquid from a portion of the first pipe at a further downstream position than the supply device and at a further upstream position than the filter, and
the switching unit is configured to be capable of switching a flow path in the first, second, and fifth pipes such that the chemical liquid and the cleaning liquid are selectively led to the supply device and the cleaning liquid does not pass through the filter.

9. The substrate processing apparatus according to claim 1, wherein
the flow path range includes the supply device and the flow path opening/closing unit,
the second pipe is configured to lead the cleaning liquid to a portion of the first pipe at a further upstream position than the supply device,
the cleaning processing section further includes a sixth pipe that is connected to the first pipe to bypass the filter, one end of the sixth pipe being connected to a portion of the first pipe at a further downstream position than the supply device and at a further upstream position than the filter, and another end of the sixth pipe being connected to a portion of the first pipe at a further downstream position than the filter and at a further upstream position than the flow path opening/closing unit, and
the switching unit is configured to be capable of switching a flow path in the first, second, and sixth pipes such that the chemical liquid and the cleaning liquid are selectively led to the supply device and the flow path opening/closing unit and the cleaning liquid does not pass through the filter.

10. The substrate processing apparatus according to claim 1, wherein
the controller is configured to determine a possibility or impossibility of supply of the cleaning liquid to the chemical liquid processing section and supply of the replacement solvent to the chemical liquid processing section, on the basis of a type of a fluid present in the flow path opening/closing unit.

11. The substrate processing apparatus according to claim 1, wherein
a plurality of chemical liquid processing sections are provided, and
the controller is configured to determine a possibility or impossibility of supply of the cleaning liquid and supply of the replacement solvent to one of the chemical liquid processing sections, on the basis of whether the supply of the cleaning liquid or the supply of the replacement solvent to each chemical liquid processing section is performed.

* * * * *